(12) United States Patent
Zhang et al.

(10) Patent No.: US 9,886,896 B2
(45) Date of Patent: Feb. 6, 2018

(54) POWER SUPPLY CIRCUIT FOR POWERING ORGANIC LIGHT EMITTING DIODE AND DISPLAY PANEL

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Boya Zhang, Beijing (CN); Chenggeng Zhang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/511,204

(22) PCT Filed: Mar. 7, 2016

(86) PCT No.: PCT/CN2016/075788
§ 371 (c)(1),
(2) Date: Mar. 14, 2017

(87) PCT Pub. No.: WO2016/192426
PCT Pub. Date: Dec. 8, 2016

(65) Prior Publication Data
US 2017/0278454 A1    Sep. 28, 2017

(30) Foreign Application Priority Data

May 29, 2015   (CN) .......................... 2015 1 0290634

(51) Int. Cl.
*H02J 3/12*   (2006.01)
*G05F 1/00*   (2006.01)
(Continued)

(52) U.S. Cl.
CPC ....... *G09G 3/3208* (2013.01); *G01R 19/0092* (2013.01); *H02M 3/156* (2013.01);
(Continued)

(58) Field of Classification Search
CPC .................................. G05F 1/468; G05F 1/573
(Continued)

(56) References Cited

U.S. PATENT DOCUMENTS 7,106,036 B1 * 9/2006 Collins ................... H02M 1/36
323/282
7,598,715 B1   10/2009 Hariman et al.
(Continued)

FOREIGN PATENT DOCUMENTS

CN    101217252 A     7/2008
CN    101281721 A    10/2008
(Continued)

OTHER PUBLICATIONS

Office Action in Chinese Application No. 201510290634.X dated Feb. 6, 2017, with English translation. 11 pages.
(Continued)

*Primary Examiner* — Gary Nash
(74) *Attorney, Agent, or Firm* — Blakely Sokoloff Taylor & Zafman LLP

(57) ABSTRACT

Embodiments of the disclosure provide a power supply circuit for powering an OLED panel and a display panel. The power supply circuit for powering the OLED panel reduces the voltage outputted by the DC-DC conversion circuit in the power supply circuit based on a target current. Moreover, the maximum value of the current that can be outputted by the DC-DC conversion circuit when outputting the reduced voltage is not less than the target current. The target current may be a current outputted by the DC-DC conversion circuit to the OLED panel at a time before a K-th preset duration
(Continued)

counting from the latest preset duration for receiving the preset pulse signal.

14 Claims, 2 Drawing Sheets

(51) Int. Cl.
    *G05F 1/573*     (2006.01)
    *G09G 3/3208*     (2016.01)
    *H02M 3/156*     (2006.01)
    *H05B 33/08*     (2006.01)
    *G01R 19/00*     (2006.01)
    *H05B 37/02*     (2006.01)

(52) U.S. Cl.
    CPC ..... *H05B 33/0815* (2013.01); *H05B 33/0896* (2013.01); *H05B 37/02* (2013.01)

(58) Field of Classification Search
    USPC ......... 323/238, 241, 246, 274–277, 283–285
    See application file for complete search history.

(56) References Cited

U.S. PATENT DOCUMENTS

| | | | |
|---|---|---|---|
| 8,111,529 B2* | 2/2012 | Cheng | H02M 1/32 323/238 |
| 2006/0279228 A1 | 12/2006 | Kato | |
| 2008/0030177 A1* | 2/2008 | Chen | G05F 1/46 323/282 |
| 2008/0238394 A1 | 10/2008 | Hasegawa et al. | |
| 2011/0187697 A1 | 8/2011 | Yun et al. | |
| 2013/0063116 A1* | 3/2013 | Sun | H03K 17/302 323/284 |
| 2013/0241507 A1* | 9/2013 | Hara | G05F 1/10 323/282 |

FOREIGN PATENT DOCUMENTS

| | | |
|---|---|---|
| CN | 101841238 A | 9/2010 |
| CN | 102237036 A | 11/2011 |
| CN | 102243841 A | 11/2011 |
| CN | 103178703 A | 6/2013 |
| CN | 103715889 A | 4/2014 |
| CN | 103795249 A | 5/2014 |
| CN | 104933987 A | 9/2015 |

OTHER PUBLICATIONS

International Search Report and Written Opinion in PCT/CN2016/075788 dated May 31, 2016, with English translation. 15 pages.

Decision on Rejection in Chinese Application No. 201510290634.X dated Jun. 23, 2017, with English translation.

\* cited by examiner

POWER SUPPLY CIRCUIT FOR POWERING ORGANIC LIGHT EMITTING DIODE AND DISPLAY PANEL

RELATED APPLICATIONS

The present application is the U.S. national phase entry of PCT/CN2016/075788, with an international filling date of Mar. 7, 2016, which claims the benefit of Chinese Patent Application NO. 201510290634.X, filed on May 29, 2015, the entire disclosure of which is incorporated herein by reference.

FIELD OF THE INVENTION

The present disclosure relates to the field of display technology, particularly to a power supply circuit for powering an organic light emitting diode and a display panel.

BACKGROUND

During the operation process of the organic light emitting diode (OLED) panel, the efficiency of the DC-DC conversion circuit that supplies power to the OLED panel refers to a ratio of the output power to the input power. The power consumption of the OLED panel may be considered as a product of the output voltage and the output current of the DC-DC conversion circuit.

At present, the DC-DC conversion circuit for powering the OLED panel generally outputs two power supply signals, that is, a boost circuit in the DC-DC conversion circuit outputs a first power supply signal VDD, and a buck-boost circuit in the DC-DC conversion circuit outputs a second power supply signal VSS. The first power supply signal VDD may have a positive voltage, and the second power supply signal VSS may have a negative voltage. The OLED panel may be supplied with a voltage difference between the first power supply signal VDD and the second power supply signal VSS, so as to enable the OLED panel to work under the driving of a driving circuit (e.g., a driver IC). When the OLED panel works normally, the voltage outputted by the DC-DC conversion circuit, i.e., the voltage difference between the first power supply signal VDD and the second power supply signal VSS, is a constant value.

Assuming that the voltage outputted by the DC-DC conversion circuit is A, the output current of the DC-DC conversion circuit will change with the variation in the load, but vary within a range [B, C] (B is smaller than C). When the load of the DC-DC conversion circuit is relatively small, the current outputted by the DC-DC conversion circuit will decrease. When the load of the DC-DC conversion circuit is relatively large, the current outputted by the DC-DC conversion circuit will increase. It can be appreciated that, in case the voltage outputted by the DC-DC conversion circuit is lower than A, the DC-DC conversion circuit may also have an output current with a value of B. When the OLED panel displays a low gray scale image, the OLED panel requires a relatively small current, in this case, the current outputted by the DC-DC conversion circuit for example may have a value of B, and the required current B may correspond to an output voltage of the DC-DC conversion circuit that is smaller than A. Hence, in such a case, if the DC-DC conversion circuit is controlled to output a current with a value of B when the voltage difference outputted by the DC-DC conversion circuit is A, too much electric energy may be consumed by the DC-DC conversion circuit is actually, thereby increasing the power consumption of the DC-DC conversion circuit and reducing the efficiency of the DC-DC conversion circuit.

To sum up, when the OLED panel works normally, the voltage outputted by the DC-DC conversion circuit may have a constant value, while the current provided by the DC-DC conversion circuit to the OLED panel will vary with the variation in load, which may result in an increased power consumption when the current outputted by the DC-DC conversion circuit to the OLED panel is relatively small, reducing the efficiency of the DC-DC conversion circuit.

SUMMARY

Embodiments of the present disclosure provide a power supply circuit for powering an OLED panel and a display panel, for mitigating or solving the problem of a relatively high power consumption and a decreased efficiency with the DC-DC conversion circuit when the current outputted by the DC-DC conversion circuit to the OLED panel is relatively small due to the fact that the voltage outputted by the DC-DC conversion circuit is a constant value while the current outputted by the DC-DC conversion circuit to the OLED panel may vary with the load.

In view of the above problem, the power supply circuit for powering an OLED panel provided by an embodiment of the disclosure comprises a DC-DC conversion circuit, a current sensor, a current controller and a soft start circuit. The current sensor may be configured to detect a current outputted by the DC-DC conversion circuit to the OLED panel in real time, the current controller may be configured to generate a control signal to the soft start circuit based on the current detected by the current sensor in real time, the soft start circuit may be configured to output a preset pulse signal to the DC-DC conversion circuit during a preset duration and output an adjusted pulse signal to the DC-DC conversion circuit based on the control signal during a time period between two adjacent preset durations for outputting the preset pulse signal, and the DC-DC conversion circuit may be configured to output a preset voltage upon receipt of the preset pulse signal, and output a reduced voltage upon receipt of the adjusted pulse signal. A maximum value of a current that is outputted by the DC-DC conversion circuit when outputting the reduced voltage is not less than a target current, this target current may be a current outputted by the DC-DC conversion circuit to the OLED panel at a time before a K-th preset duration counting from the latest preset duration for receiving the preset pulse signal, and k is a natural number.

Another embodiment of the present disclosure provides a display panel which may comprise the power supply circuit for powering the OLED panel provided by the embodiment of the disclosure.

For the power supply circuit for powering the OLED panel and the display panel provided by the embodiment of the disclosure, the current controller thereof can, based on the current outputted by the DC-DC conversion circuit to the OLED panel detected by the current sensor in real time, generate a control signal to the soft start circuit. The soft start circuit outputs a preset pulse signal to the DC-DC conversion circuit during a preset duration, and outputs an adjusted pulse signal to the DC-DC conversion circuit based on the received control signal during a time period between two adjacent preset durations for outputting the preset pulse signal. The DC-DC conversion circuit outputs a preset voltage upon receipt of the preset pulse signal, and outputs a reduced voltage upon receipt of the adjusted pulse signal.

The maximum value of the current that can be outputted by the DC-DC conversion circuit when outputting the reduced voltage is not less than a target current (the target current may be a current outputted by the DC-DC conversion circuit to the OLED panel at a time before a K-th preset duration counting from the latest preset duration for receiving the preset pulse signal). Hence, in the event that the target current is less than the maximum value of the current that can be outputted by the DC-DC conversion circuit when outputting the preset voltage, the DC-DC conversion circuit can reduce the outputted voltage and output the target current, thereby reducing the power consumption of the power supply circuit for powering the OLED panel and improving the efficiency of the power supply circuit for powering the OLED panel.

DETAILED DESCRIPTION OF EMBODIMENTS

Next, some embodiments of the power supply circuit for powering the OLED panel and the display panel will be explained with reference to the drawings.

The power supply circuit for powering the OLED panel provided by an embodiment of the disclosure comprises a DC-DC conversion circuit, a current sensor, a current controller and a soft start circuit. The current sensor is used for detecting a current outputted by the DC-DC conversion circuit to the OLED panel in real time. The current controller is used for, based on the current detected by the current sensor in real time, generating a control signal to the soft start circuit. The soft start circuit may output a preset pulse signal to the DC-DC conversion circuit during a preset duration, and output an adjusted pulse signal to the DC-DC conversion circuit based on the received control signal between two adjacent time durations for outputting the preset pulse signal. The DC-DC conversion circuit is configured to output a preset voltage upon receipt of the preset pulse signal, and output a reduced voltage upon receipt of the adjusted pulse signal. A maximum value of a current that can be outputted by the DC-DC conversion circuit when outputting the reduced voltage is not less than a target current, this target current may be a current outputted by the DC-DC conversion circuit to the OLED panel at a time before a K-th preset duration counting from the latest preset duration for receiving the preset pulse signal, and k is a natural number. For example, the target current can be a current for driving the brightest pixel on the OLED panel within a preset duration.

In the embodiments of the disclosure, the preset duration mentioned may be a duration required for displaying a frame image by the OLED panel, i.e., a time period corresponding to one frame. The target current may be a current for driving the brightest pixel on the OLED panel within one frame time. By selecting such a target current, the pixel with the highest brightness on the display panel can be driven within the preset duration (e.g., a time period of one frame), which is advantageous for the level of the image displayed by the OLED panel. It can be well understood that the brightest pixels of different images may have different brightness levels, so the target currents for different frames may also be different.

Figure 4:
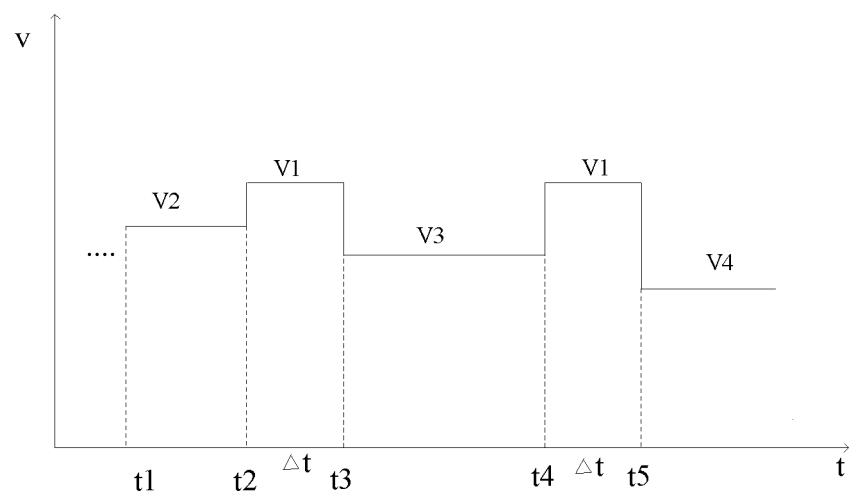
FIG. 4 schematically depicts variation of an output voltage of the DC-DC conversion circuit in the power supply circuit for powering an OLED panel provided by an embodiment of the disclosure.

Next, referring to FIG. 4, the variation in the output voltage of the DC-DC conversion circuit in the power supply circuit for powering the OLED panel provided by an embodiment of the disclosure will be discussed by way of example. As shown in FIG. 4, the preset duration is represented by $\Delta t$. The two preset durations shown in FIG. 4 are located between a time point t2 and a time point t3, and between a time point t4 and a time point t5 respectively. Each preset duration $\Delta t$ may indicate a duration required for displaying one frame image by the OLED panel. During each preset duration $\Delta t$, the DC-DC conversion circuit receives a preset pulse signal so as to output a preset voltage V1. Whereas during the period between two adjacent preset durations $\Delta t$ for outputting the preset voltage V1, the DC-DC conversion circuit receives an adjusted pulse signal so as to output a reduced voltage V3. The duration (i.e., t3-t4) for outputting the reduced voltage V3 can be more than one frame time.

Because different frames may have different variations in brightness, the target currents for different frames may be different. Accordingly, the reduced output voltages may also be different. That is to say, the reduced voltages outputted by the DC-DC conversion circuit within different time periods may correspond to particular target currents. For example, as shown in FIG. 4, before the preset duration $\Delta t$ between the time point t2 and the time point t3, the reduced output voltage V2 is lower than the preset voltage V1, but may be higher than the reduced voltage V3. After the preset duration $\Delta t$ between the time point t4 and the time point t5, the reduced output voltage V4 is lower than the preset voltage V1 and is also lower than the reduced voltage V3.

Figure 5:
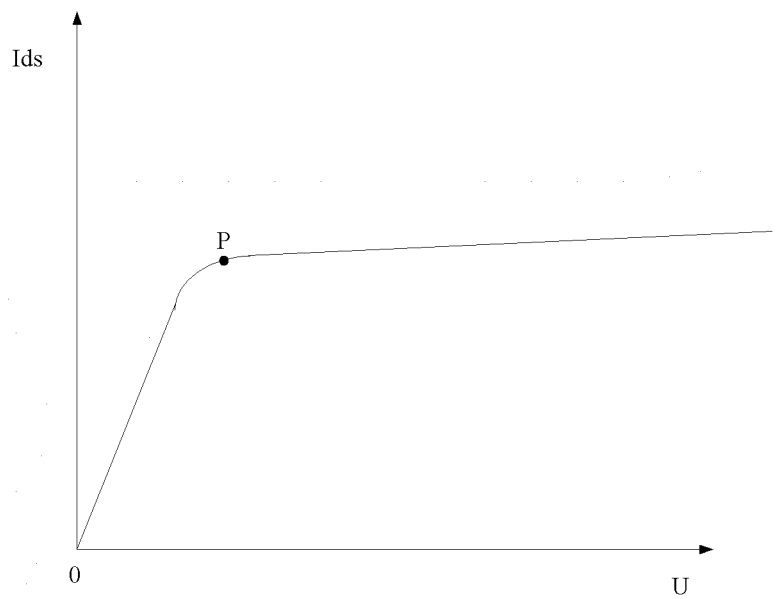
FIG. 5 schematically depicts an output characteristic curve of a thin film transistor in a pixel circuit within the OLED panel.

In an embodiment, the above mentioned reduced voltages such as V2, V3 and V4 can be determined based on the output characteristic curve of the thin film transistor in the pixel circuit of the OLED panel for driving the OLED. For example, the output characteristic curve of the thin film transistor may be as shown in FIG. 5. When the thin film transistor operates in a saturation region, the current flowing through the thin film transistor may vary little with the change of the source-drain voltage U for the thin film transistor, and even be stable. That is to say, in such a case, no matter how large the voltage supplied by the external power supply circuit to the OLED panel is, the current flowing through the OLED varies little, or even does not change substantially. Hence, it is benefit for reducing the power consumption of the OLED panel to set the voltage at a critical point (e.g., point P shown in FIG. 5) between a linear region and the saturation region on the output characteristic curve of the thin film transistor as the reduced voltages V2, V3 and V4.

For the power supply circuit for powering the OLED panel provided by the embodiment of the disclosure, the DC-DC conversion circuit will reduce the output voltage based on the received adjusted pulse signal after receiving the preset pulse signal, moreover, the DC-DC conversion circuit may output a current not less than the target current when outputting the reduced voltage. Hence, in the event that the target current is less than the maximum value of the current that can be provided by the DC-DC conversion circuit when outputting the preset voltage, the DC-DC conversion circuit can reduce the outputted voltage and provide the target current, thereby reducing the power consumption of the power supply circuit for powering the OLED panel, and improving the efficiency of the power supply circuit for powering the OLED panel.

The DC-DC conversion circuit may comprise a boost circuit and a buck-boost circuit. The voltage outputted by the DC-DC conversion circuit thus can be a difference between the voltage of a first power supply signal VDD outputted by the boost circuit and a voltage of a second power supply signal VSS outputted by the buck-boost circuit. Hence, the voltage outputted by the DC-DC conversion circuit can be changed by changing only one of the voltage of the first power supply signal VDD outputted by the boost circuit and the voltage of the second power supply signal VSS outputted by the buck-boost circuit, alternatively by changing both the voltage of the first power supply signal VDD outputted by the boost circuit and the voltage of the second power supply signal VSS outputted by the buck-boost circuit.

In terms of the characteristics of the OLED display panel, explanations will be made only by taking the example that the voltage outputted by the DC-DC conversion circuit is changed by changing the voltage of the second power supply signal VSS outputted by the buck-boost circuit. When the voltage outputted by the DC-DC conversion circuit needs to be increased, the voltage of the second power supply signal VSS outputted by the buck-boost circuit may be reduced. When the voltage outputted by the DC-DC conversion circuit needs to be reduced, the voltage of the second power supply signal VSS outputted by the buck-boost circuit can be increased. For the case of changing the voltage outputted by the DC-DC conversion circuit by changing the voltage of the second power supply signal VSS outputted by the buck-boost circuit, the power supply circuit for powering the OLED panel provided by an embodiment of the disclosure is shown in FIG. 1.

Figure 1:
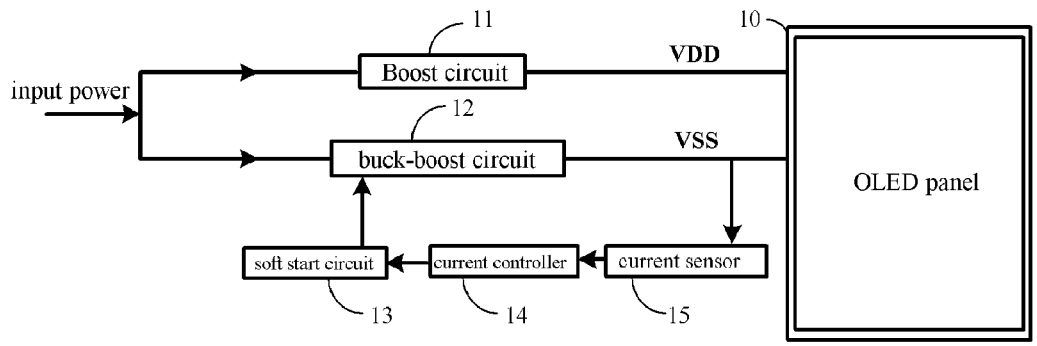
FIG. 1 is a structural schematic view of a power supply circuit for powering an OLED panel provided by an embodiment of the present disclosure.

As for the power supply circuit for powering the OLED panel as shown in FIG. 1, the current sensor 15 may detect the current outputted by the DC-DC conversion circuit to the OLED panel 10 in real time, i.e., detecting the current in the return circuit constituted by the boost circuit 11, the buck-boost circuit 12 and the OLED panel 10. The current controller 14 can generate a control signal to the soft start circuit 13 based on the current detected by the current sensor 15 in real time. The soft start circuit 13 can output a preset pulse signal to the buck-boost circuit 12 during a preset duration, and output an adjusted pulse signal to the buck-boost circuit 12 based on the received control signal between two adjacent time periods for outputting the preset pulse signal. The buck-boost circuit 12 may output a second power supply signal VSS whose voltage value is equal to the difference between the voltage of the first power supply signal VDD and the preset voltage upon receipt of the preset pulse signal, and output an increased voltage upon receipt of the adjusted pulse signal.

That is to say, the buck-boost circuit 12 may reduce the voltage of the second power supply signal VSS to the difference between the voltage of the first power supply signal VDD and the preset voltage during the preset duration, and then increase it from the difference between the voltage of the first power supply signal VDD and the preset voltage based on the adjusted pulse signal received from the soft start circuit.

In addition, since the current detector detects the current outputted by the DC-DC conversion circuit to the OLED panel in real time, in order to avoid abnormal display of the OLED panel caused by continuous adjustment of the voltage outputted by the DC-DC conversion circuit due to continuous variation in the current detected in real time, another embodiment provides a further power supply circuit for powering the OLED panel. This power supply circuit for powering the OLED panel can adjust the voltage outputted by the DC-DC conversion circuit based on an average current during a time period for displaying a frame image by the OLED panel.

With respect to such power supply circuit for powering the OLED panel, the preset duration may be a duration required for displaying one frame image by the OLED panel. The current controller 14 can determine an average current during a time period for displaying the N-th frame image by the OLED panel based on the currents detected by the current sensor 15 in real time when the OLED panel 10 displaying the N-th frame image, and generate a control signal to the soft start circuit 13 based on the average current. The soft start circuit 13 may output the preset pulse signal to the DC-DC conversion circuit when the OLED panel 10 receives a data signal for each frame image, and output an adjusted pulse signal to the DC-DC conversion circuit based on the received control signal when the OLED panel 10 displays a (N+k+1)-th frame of image. In this embodiment, the target current can be the average current during the time period for displaying the N-th frame image by the OLED panel 10. When the OLED panel displays the (N+k+1)-th frame image, a maximum value of a current that can be outputted by the DC-DC conversion circuit when outputting the adjusted voltage is not less than the target current.

For example, in an embodiment, k=0. In other words, in this case, the DC-DC conversion circuit will reduce the voltage outputted by the DC-DC conversion circuit when the OLED panel displays a (N+1)-th frame image based on the average current outputted by the DC-DC conversion circuit to the OLED panel during the time period for displaying the N-th frame image by the OLED panel. Moreover, the maximum value of the current that can be outputted by the DC-DC conversion circuit when outputting the reduced voltage may be greater than the average current outputted by the DC-DC conversion circuit to the OLED panel when the OLED panel displays the N-th frame of image.

The DC-DC conversion circuit may comprise a boost circuit and a buck-boost circuit. The voltage outputted by the DC-DC conversion circuit is can be a difference between the voltage of the first power supply signal VDD outputted by the boost circuit and the voltage of the second power supply signal VSS outputted by the buck-boost circuit. Hence, for the case of adjusting the output voltage of the DC-DC conversion circuit by adjusting the voltage of the second power supply signal VSS outputted by the buck-boost circuit, the power supply circuit for powering the OLED panel provided by this embodiment of the present disclosure also can be explained by referring to FIG. 1. The soft start circuit 13 may output a preset pulse signal to the buck-boost circuit 12 when a data signal for each frame image is being loaded for the OLED panel 10, and output the adjusted pulse signal to the buck-boost circuit 12 based on the received control signal when the OLED panel 10 displays the (N+k+1)-th frame image. The buck-boost circuit 12 may, upon receipt of the preset pulse signal, output a second power supply signal VSS whose voltage value is equal to a difference between the voltage of the first power supply signal VDD and the preset voltage, and upon receipt of the adjusted pulse signal, increase the voltage of the second power supply signal VSS outputted by the buck-boost circuit 12.

In an embodiment, the maximum value of the current that can be outputted by the DC-DC conversion circuit when outputting the adjusted voltage may be equal to the target current when the OLED panel 10 displays the (N+k+1)-th frame image, i.e., equal to the average current when the OLED panel 10 displays the N-th frame of image. Thus, the power consumption of the power supply circuit for powering the OLED panel can be further reduced, thereby further improving the efficiency of the power supply circuit for powering the OLED panel.

Figure 2:
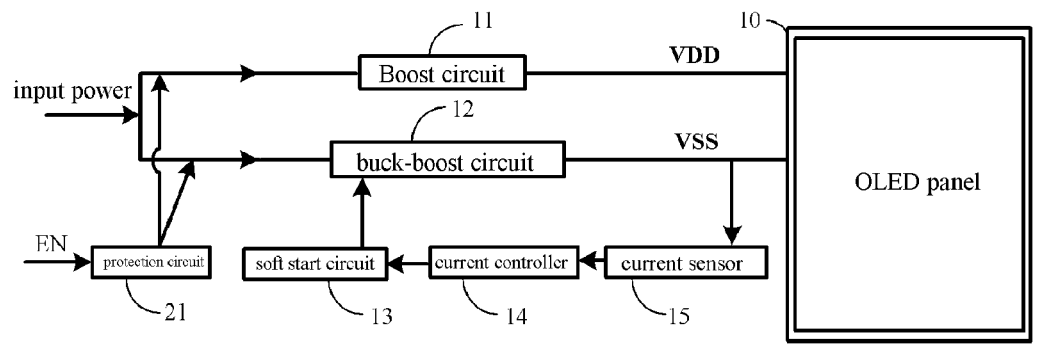
FIG. 2 is a structural schematic view of a power supply circuit for powering an OLED panel provided by another embodiment of the present disclosure.

As shown in FIG. 2, a power supply circuit for powering the OLED panel according to another embodiment of the present disclosure is provided, which further comprises a protection circuit 21 being capable of receiving an enable signal EN, and triggering the DC-DC conversion circuit to startup when a voltage of the enable signal EN is within a safety range. The enable signal EN may be in a form of pulse signal.

Further, the protection circuit 21 can further keep the DC-DC conversion circuit in an inactive state when the voltage of the enable signal EN is greater than a maximum value of the safety range, so as to protect the power supply circuit for powering the OLED panel from being impacted by high voltages.

Figure 3:
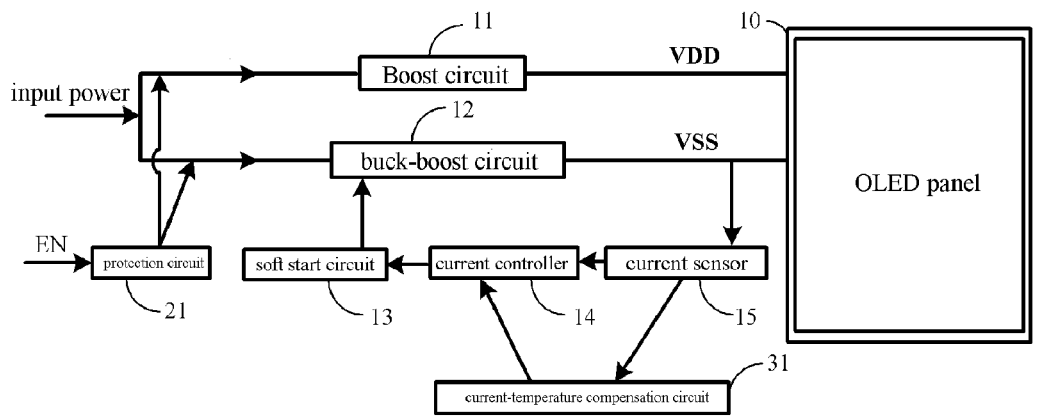
FIG. 3 is a structural schematic view of a power supply circuit for powering an OLED panel provided by a further embodiment of the present disclosure.

As for the above embodiments, since the current sensor, the current controller and the soft start circuit are added in the power supply for powering the OLED panel, and the added circuits may consume some electric energy, which may cause the maximum value of the current that can be outputted by the power supply circuit for powering the OLED panel according to the embodiments of the disclosure to be less than the maximum value of the current that can be outputted by the conventional DC-DC conversion circuit in case the power supply circuit for powering the OLED panel of the embodiments of the present disclosure and the conventional DC-DC conversion circuit provide the same voltage. Hence, as shown in FIG. 3, a power supply circuit for powering the OLED panel according to a further embodiment of the present disclosure can further comprise a current-temperature compensation circuit 31, which can compensate the current outputted to the OLED panel, so that the maximum value of the current that can be outputted by the power supply circuit for powering the OLED panel according to the embodiments of the present disclosure can be equal to the maximum value of the current that can be outputted by the conventional DC-DC conversion circuit in case the power supply circuit for powering the OLED panel in the embodiments of the present disclosure and the conventional DC-DC conversion circuit output the same voltage.

Further, the current outputted by the DC-DC conversion circuit itself may be sensitive to ambient temperature, hence, compensation may be made for the temperature, so as to enable the current outputted by the power supply circuit for powering the OLED panel not to be influenced by the temperature. For example, the current-temperature compensation circuit 31 may perform temperature compensation to the current outputted by the power supply circuit for powering the OLED panel by each frame.

The current sensor, the current controller, the soft start circuit, and the current-temperature compensation circuit in the power supply circuit for powering the OLED panel provided by the embodiments of the present disclosure may all be integrated in the DC-DC conversion circuit, alternatively, some of them are integrated in the DC-DC conversion circuit, and the others are arranged outside the DC-DC conversion circuit. Further, all of them may also be arranged outside the DC-DC conversion circuit.

A further embodiment of the present disclosure provides a display panel, comprising the power supply circuit for powering the OLED panel provided by the embodiment of the disclosure.

A person having an ordinary skill in the art will understand that a drawing is only a schematic view for a preferred embodiment. The modules or processes in the drawing are not necessarily required for carrying out the present disclosure.

The person having an ordinary skill in the art can understand that the modules in the device of an embodiment may be distributed in the device of the embodiment according to the description for the embodiment, but may also be located in one or more devices different from this embodiment. The modules of the above embodiment can be combined into one module and can also be further divided into a plurality of sub-modules.

The serial numbers for the embodiments of the present disclosure are only for describing purpose rather than representing preferences of the embodiments.

Apparently, the person having an ordinary skill in the art can make various modifications and variations to embodiments of the present disclosure without departing from the spirit and the scope of the disclosure. In this way, provided that these modifications and variations to embodiments of the present disclosure fall within the scopes of the claims and the equivalent technologies thereof, the present disclosure also intends to encompass these modifications and variations.

The invention claimed is:

1. A power supply circuit for powering an OLED panel, comprising a DC-DC conversion circuit, a current sensor, a current controller and a soft start circuit,
    wherein the current sensor is configured to detect a current outputted by the DC-DC conversion circuit to the OLED panel in real time;
    the current controller is configured to generate a control signal to the soft start circuit based on the current detected by the current sensor in real time;
    the soft start circuit is configured to output a preset pulse signal to the DC-DC conversion circuit during a preset duration and output an adjusted pulse signal to the DC-DC conversion circuit based on the control signal during a time period between two adjacent preset durations for outputting the preset pulse signal;
    the DC-DC conversion circuit is configured to output a preset voltage upon receipt of the preset pulse signal, and output a reduced voltage upon receipt of the adjusted pulse signal;
    wherein a maximum value of a current that is outputted by the DC-DC conversion circuit when outputting the reduced voltage is not less than a target current, this target current is a current outputted by the DC-DC conversion circuit to the OLED panel at a time before a K-th preset duration counting from the latest preset duration for receiving the preset pulse signal, and k is a natural number.

2. The power supply circuit according to claim 1, wherein the preset duration is a duration required by the OLED panel for displaying one frame image;

wherein the current controller is configured to determine an average current when the OLED panel displays a N-th frame image based on a current detected by the current sensor in real time when the OLED panel displays the N-th frame image, and generate the control signal to the soft start circuit based on the average current;

wherein the soft start circuit is configured to output the preset pulse signal to the DC-DC conversion circuit when a data signal for each frame image is being loaded for the OLED panel, and output the adjusted pulse signal to the DC-DC conversion circuit based on the control signal when the OLED panel displays a (N+k+1)-th frame image;

wherein the target current is the average current when the OLED panel displays the N-th frame image, wherein when the OLED panel displays the (N+k+1)-th frame image, a maximum value of a current that is outputted by the DC-DC conversion circuit when outputting the adjusted voltage is not less than the target current.

3. The power supply circuit according to claim 2, wherein the DC-DC conversion circuit comprises a boost circuit and a buck-boost circuit, a voltage outputted by the DC-DC conversion circuit is a difference between a voltage of a first power supply signal outputted by the boost circuit and a voltage of a second power supply signal outputted by the buck-boost circuit;

wherein the soft start circuit is configured to output the preset pulse signal to the buck-boost circuit when the data signal for each frame image is being loaded for the OLED panel, and output the adjusted pulse signal to the buck-boost circuit based on the control signal when the OLED panel displays the (N+k+1)-th frame image;

wherein the buck-boost circuit is configured to, upon receipt of the preset pulse signal, output a second power supply signal whose voltage value is equal to a difference between the voltage of the first power supply signal and the preset voltage, and upon receipt of the adjusted pulse signal, increase the voltage of the second power supply signal.

4. The power supply circuit according to claim 2, wherein the maximum value of the current that is outputted by the DC-DC conversion circuit when outputting the reduced voltage is equal to the target current when the OLED panel displays the (N+k+1)-th frame image.

5. The power supply circuit according to claim 1, wherein k=0.

6. The power supply circuit according to claim 1, wherein the power supply circuit further comprises a protection circuit, which is configured to receive an enable signal, and trigger the DC-DC conversion circuit to startup when a voltage of the enable signal is within a safety range.

7. The power supply circuit according to claim 6, wherein the protection circuit is further configured to keep the DC-DC conversion circuit in an inactive state when the voltage of the enable signal is greater than a maximum value of the safety range.

8. A display panel, comprising a power supply circuit for powering an OLED, the power supply circuit comprising a DC-DC conversion circuit, a current sensor, a current controller and a soft start circuit, wherein the current sensor is configured to detect a current outputted by the DC-DC conversion circuit to the OLED panel in real time;

the current controller is configured to generate a control signal to the soft start circuit based on the current detected by the current sensor in real time;

the soft start circuit is configured to output a preset pulse signal to the DC-DC conversion circuit during a preset duration and output an adjusted pulse signal to the DC-DC conversion circuit based on the control signal during a time period between two adjacent preset durations for outputting the preset pulse signal;

the DC-DC conversion circuit is configured to output a preset voltage upon receipt of the preset pulse signal, and output a reduced voltage upon receipt of the adjusted pulse signal;

wherein a maximum value of a current that is outputted by the DC-DC conversion circuit when outputting the reduced voltage is not less than a target current, this target current is a current outputted by the DC-DC conversion circuit to the OLED panel at a time before a K-th preset duration counting from the latest preset duration for receiving the preset pulse signal, and k is a natural number.

9. The display panel according to claim 8, wherein the preset duration is a duration required by the OLED panel for displaying one frame image;

wherein the current controller is configured to determine an average current when the OLED panel displays a N-th frame image based on a current detected by the current sensor in real time when the OLED panel displays the N-th frame image, and generate the control signal to the soft start circuit based on the average current;

wherein the soft start circuit is configured to output the preset pulse signal to the DC-DC conversion circuit when a data signal for each frame image is being loaded for the OLED panel, and output the adjusted pulse signal to the DC-DC conversion circuit based on the control signal when the OLED panel displays a (N+k+1)-th frame image;

wherein the target current is the average current when the OLED panel displays the N-th frame image, wherein when the OLED panel displays the (N+k+1)-th frame image, a maximum value of a current that is outputted by the DC-DC conversion circuit when outputting the adjusted voltage is not less than the target current.

10. The display panel according to claim 9, wherein the DC-DC conversion circuit comprises a boost circuit and a buck-boost circuit, a voltage outputted by the DC-DC conversion circuit is a difference between a voltage of a first power supply signal outputted by the boost circuit and a voltage of a second power supply signal outputted by the buck-boost circuit;

wherein the soft start circuit is configured to output the preset pulse signal to the buck-boost circuit when the data signal for each frame image is being loaded for the OLED panel, and output the adjusted pulse signal to the buck-boost circuit based on the control signal when the OLED panel displays the (N+k+1)-th frame image;

wherein the buck-boost circuit is configured to, upon receipt of the preset pulse signal, output a second power supply signal whose voltage value is equal to a difference between the voltage of the first power supply signal and the preset voltage, and upon receipt of the adjusted pulse signal, increase the voltage of the second power supply signal.

11. The display panel according to claim 9, wherein the maximum value of the current that is outputted by the DC-DC conversion circuit when outputting the reduced voltage is equal to the target current when the OLED panel displays the (N+k+1)-th frame image.

12. The display panel according to claim 8, wherein k=0.

13. The power supply circuit according to claim 8, wherein the power supply circuit further comprises a protection circuit, which is configured to receive an enable signal, and trigger the DC-DC conversion circuit to startup when a voltage of the enable signal is within a safety range.

14. The display panel according to claim 13, wherein the protection circuit is further configured to keep the DC-DC conversion circuit in an inactive state when the voltage of the enable signal is greater than a maximum value of the safety range.

* * * * *